United States Patent
Xia et al.

(10) Patent No.: US 7,609,531 B2
(45) Date of Patent: Oct. 27, 2009

(54) FLAT PANEL DISPLAY HAVING SHIELD COVER FOR ELECTROMAGNETIC INTERFERENCE PROTECTION

(75) Inventors: Rong-Ping Xia, Shenzhen (CN); Xian-Lei Meng, Shenzhen (CN); Zhao-Hui Hu, Shenzhen (CN); Lei Guo, Shenzhen (CN)

(73) Assignees: Innocom Technology (Shenzhen) Co., Ltd., Shenzhen, Guangdong Province (CN); Innolux Display Corp., Miao-Li County (TW)

( * ) Notice: Subject to any disclaimer, the term of this patent is extended or adjusted under 35 U.S.C. 154(b) by 0 days.

(21) Appl. No.: 11/998,044

(22) Filed: Nov. 27, 2007

(65) Prior Publication Data
US 2008/0123317 A1  May 29, 2008

(30) Foreign Application Priority Data
Nov. 27, 2006 (TW) ............... 95143788 A

(51) Int. Cl.
H05K 9/00 (2006.01)
(52) U.S. Cl. ............ 361/816; 361/800; 361/818; 361/807; 174/350
(58) Field of Classification Search ........ 361/753, 361/799, 800, 816, 818, 683, 807; 174/350, 174/354, 355
See application file for complete search history.

(56) References Cited

U.S. PATENT DOCUMENTS

| | | | |
|---|---|---|---|
| 5,805,251 A * | 9/1998 | Ozawa ............... 349/110 |
| 5,946,061 A * | 8/1999 | Kurihara et al. ........ 349/58 |
| 6,330,150 B1 * | 12/2001 | Kim ................ 361/683 |
| 6,480,243 B2 * | 11/2002 | Yamamoto ........... 348/836 |
| 6,560,124 B1 * | 5/2003 | Irie et al. ............ 361/816 |
| 6,683,796 B2 * | 1/2004 | Radu et al. .......... 361/818 |
| 6,688,576 B2 * | 2/2004 | Oishi et al. .......... 248/317 |
| 6,976,781 B2 | 12/2005 | Chu et al. |
| 7,034,220 B2 * | 4/2006 | Kim et al. ........... 361/816 |
| 7,170,759 B2 * | 1/2007 | Soga ................ 361/825 |
| 7,274,559 B2 * | 9/2007 | Kim ................ 361/681 |
| 7,313,002 B2 * | 12/2007 | Yuan et al. .......... 361/818 |
| 2005/0168954 A1 * | 8/2005 | Kim ................ 361/725 |
| 2006/0146505 A1 * | 7/2006 | Kim et al. ........... 361/752 |

* cited by examiner

*Primary Examiner*—Dameon E Levi
(74) *Attorney, Agent, or Firm*—Wei Te Chung

(57) ABSTRACT

An exemplary flat panel display (200) includes a display module (210), a printed circuit board (220), and a shield member (230). The display module includes a rear surface (212) and a side surface 214 adjacent to the rear surface. The printed circuit board is electrically coupled to the display module. The shield member is configured to protect the printed circuit board from electromagnetic interference, and includes a shield cover (236) and a fixing member (232). The shield cover and the fixing member are separate parts. The printed circuit board is received in the shield cover, the fixing member is fixed onto the side surface of the display module, and the shield cover is fixed onto the rear surface of the display module via the fixing member.

18 Claims, 5 Drawing Sheets

FLAT PANEL DISPLAY HAVING SHIELD COVER FOR ELECTROMAGNETIC INTERFERENCE PROTECTION

FIELD OF THE INVENTION

The present invention relates to flat panel displays, and more particularly to a flat panel display having a shield cover for protecting the flat panel display from electromagnetic interference (EMI).

GENERAL BACKGROUND

Flat panel displays are widely used in modern display devices due to their advantages such as portability, low power consumption, and low radiation. A typical flat panel display usually includes control circuits disposed inside for providing control signals. However, ambient electromagnetic waves are liable to interfere with the control circuits, and cause the control circuits to provide erroneous signals. To overcome the above-described problem, a shielding member is usually disposed in the flat panel display for EMI protection.

FIG. 5 is an exploded, isometric view of a conventional flat panel display. The flat panel display 100 includes a display module 110, a printed circuit board (PCB) 120, a shield member 130, and a back shell 140.

The display module 110 includes a display surface 111, a rear surface 112 opposite to the display surface 111, and four side surfaces 114 adjacent to both the display surface 111 and the rear surface 112. The PCB 120 includes a plurality of control circuits (not labeled) thereon, which are electrically coupled to the display module 110. The back shell 140 includes a main body 142 and an extending portion 146, and is configured to receive the display module 110, the PCB 120, and the shield member 130. The main body 142 and the extending portion 146 are integrally formed, and the extending portion 146 extends outwards from the central section of the main body 142.

The shield member 130 is typically made of metal, and includes a rear plate 131, four sidewalls 134, and a shield cover 136. The rear plate 131, the sidewalls 134, and the shield cover 136 are integrally formed. Each of the sidewalls 134 extends in a same direction perpendicularly from a respective edge of the rear plate 131, so as to form a container structure (not labeled) for receiving the display module 110. The shield cover 136 is disposed on the central section of the rear plate 131, and is configured as a box-like structure for receiving the PCB 120. Moreover, the shield cover 136 is in a position corresponding to the extending portion 146 of the back shell 140.

In assembly, firstly, the PCB 120 is engaged into the shield cover 136 of the shield member 130. Secondly, the display module 110 is engaged and received in the container structure of the shield member 130, so that the rear plate 131 faces the rear surface 112 of the display module 110, and each sidewall 134 faces a respective side surface 114 of the display module 110. Thirdly, the assembled display module 110, PCB 120, and shield member 130 is engaged into the back shell 140, with the shield cover 136 contained in the extending portion 146 of the back shell 140. Finally, a front frame (not shown) is provided and fixed to the back shell 140, so as to contain the assembled display module 110, PCB 120, and shield member 130 tightly.

When the flat panel display 100 is in operation, the shield member 130, particularly the shield cover 136 thereof, prevents ambient electromagnetic waves from interfering with the control circuits on the PCB 120. Thereby, outputting of erroneous signals by the control circuits to the display module 110 is avoided. However, with the above-described configuration, in order to fix the shield cover 136 to the display module 110, a rear plate 131 and four sidewalls 134 are necessary in the shield member 130. In fact, the rear plate 131 and the sidewalls 134 are incidental to or even unneeded for the EMI protection of the flat panel display 100. The rear plate 131 and the sidewalls 134 constitute extra material that is needed to make the shield member 130. This adds to the cost of manufacturing the flat panel display 100.

It is, therefore, desired to provide a flat panel display which overcomes the above-described deficiencies.

SUMMARY

In one aspect, a flat panel display includes a display module, a printed circuit board, and a shield member. The display module includes a rear surface and a side surface adjacent to the rear surface. The printed circuit board is electrically coupled to the display module. The shield member is configured to protect the printed circuit board from electromagnetic interference, and includes a shield cover and a fixing member. The shield cover and the fixing member are separate parts. The printed circuit board is received in the shield cover, the fixing member is fixed onto the side surface of the display module, and the shield cover is fixed onto the rear surface of the display module via the fixing member.

In another aspect, a flat panel display includes a display module, a printed circuit board, and a shield member. The display module includes a rear surface and a side surface adjacent to the rear surface. The printed circuit board is electrically coupled to the display module. The shield member is configured to protect the printed circuit board from electromagnetic interference, and includes a shield cover and a fixing member. The fixing member includes a plurality of fixing fingers. The printed circuit board is received in the shield cover, the fixing member is fixed to the side surface of the display module, and the shield cover is fixed onto a desired position of the rear surface via a selected one of the fixing fingers of the fixing member.

Other novel features and advantages will become more apparent from the following detailed description when taken in conjunction with the accompanying drawings.

DETAILED DESCRIPTION OF PREFERRED EMBODIMENTS

Reference will now be made to the drawings to describe preferred and exemplary embodiments of the present invention in detail.

Figure 1:
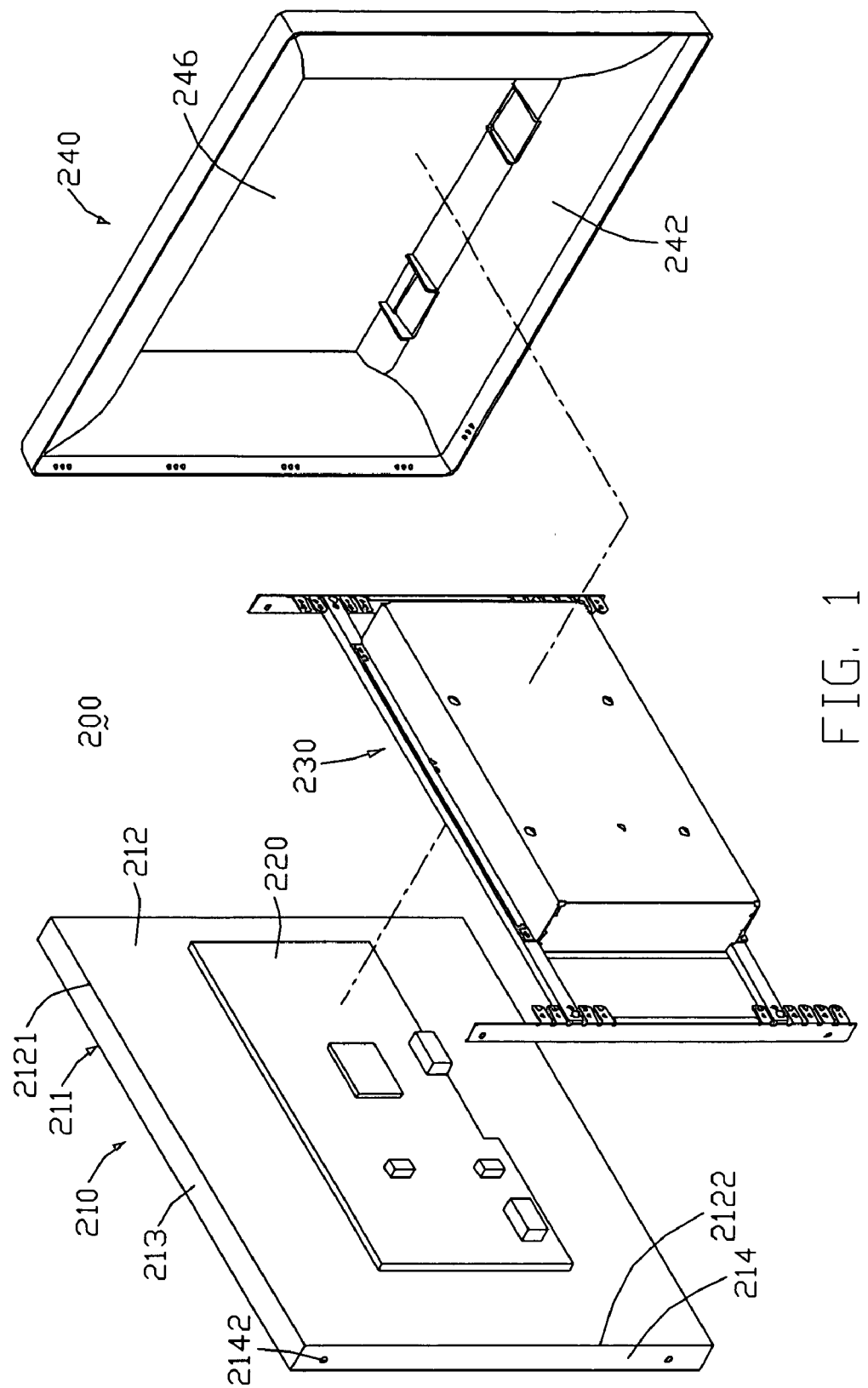
FIG. 1 is an exploded, isometric view of a flat panel display according to a first exemplary embodiment of the present invention, the flat panel display including a shield member.

FIG. 1 is an exploded, isometric view of a flat panel display according to a first exemplary embodiment of the present invention. The flat panel display 200 includes a display module 210, a PCB 220, a shield member 230, and a back shell 240.

The display module 210 includes a display surface 211, a rear surface 212 opposite to the display surface 211, two first side surfaces 213, and two second side surfaces 214. The rear surface 212 has a rectangular shape, which includes a pair of long borders 2121 in parallel, and a pair of short borders 2122 perpendicular to the long borders 2121. Each of the first side surfaces 213 is disposed adjacent to a respective long border 2121 of the rear surface 212. Each of the second side surfaces 214 is disposed adjacent to a respective short border 2122 of the rear surface 212, and includes two first screw holes 2142. The first screw holes 2142 are respectively disposed at each end of the second side surface 214 adjacent to the first side surface 213. The display module 210 can for example be one of a liquid crystal display panel, a plasma display panel, and an organic light emitting display panel.

The PCB 220 includes a plurality of control circuits (not labeled) thereon. The control circuits are electrically coupled to the display module 210, and are configured to provide control signals for controlling the display module 210 to display images.

The back shell 240 includes a main body 242 and an extending portion 246, and is configured to receive the display module 210, the PCB 220, and the shield member 230. The main body 242 and the extending portion 246 are integrally formed. The extending portion 246 extends outwards from the central section of the main body 242, so as to form an accommodating space.

Figure 2:
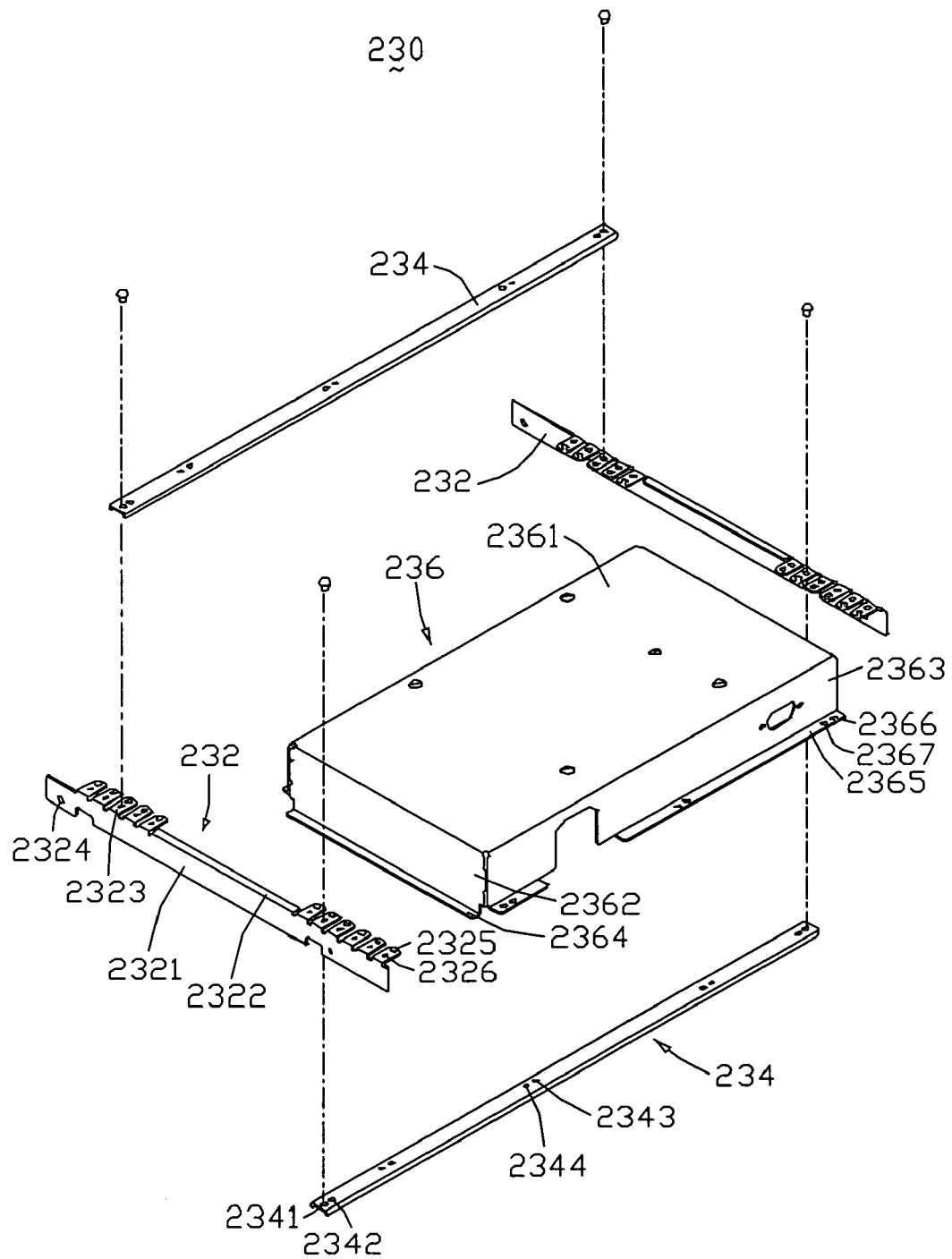
FIG. 2 is a rear, exploded, isometric view of the shield member of the flat panel display of FIG. 1.

FIG. 2 is an rear, exploded, isometric view of the shield member 230. The shield member 230 includes a pair of first fixing members 232, a pair of second fixing members 234, and a shield cover 236. The first fixing members 232 and the second fixing members 234 are configured to fix the shield cover 236 to the display module 210.

The shield cover 236 has a box-like structure for receiving the PCB 220. Thus the size of the shield cover 236 is determined according to the size of the PCB 220. The shield cover 236 includes a rectangular bottom plate 2361, two first sidewalls 2362, and two second sidewalls 2363 formed integrally. Each of the first sidewalls 2362 extends from a respective short edge of the rectangular bottom plate 2361 perpendicularly, and each of the second sidewalls 2363 perpendicularly extends from a respective long edge of the rectangular bottom plate 2361. Moreover, each of the first sidewalls 2362 includes a respective first supporting portion 2634 extending outwards from an edge thereof. Both of the first supporting portions 2634 are coplanar, and parallel to the bottom plate 2361. Each of the second sidewalls 2363 includes a respective second supporting portion 2365 extending outwards from an edge thereof. Both of the second supporting portions 2635 are also coplanar, and parallel to the bottom plate 2361. A distance between the bottom plate 2361 and the first supporting portion 2364 is a little greater than a distance between the bottom plate 2361 and the second supporting portion 2365. Furthermore, each of the second supporting portions 2365 includes three first fixing structures, and each of the first fixing structures includes a first positioning hole 2367 and a second screw hole 2366. A first one of the three fixing structures is disposed in the middle of the second supporting portion 2365, and the other two first fixing structures are disposed at respective ends of the second supporting portion 2365.

Each of the first fixing members 232 is elongate, and includes a main plate 2321, a flange 2322, and a plurality of fixing fingers 2323 formed integrally. A length of the main plate 2321 is the same as a length of the short border 2122 of the rear surface 212 of the display module 210. The main plate 2321 includes a pair of third screw holes 2324, each of which is disposed at a respective end thereof and corresponds to a respective first screw hole 2141 in the second side surface 214 of the display module 210. The flange 2322 extends perpendicularly from the middle of an edge of the main plate 2321. The fixing fingers 2323 extend from the same edge of the main plate 2321, and are disposed at both sides of the flange 2322, so as to form two comb-like structures of the first fixing member 232. Each of the fixing fingers 2323 has a shape and a size the same as the others, and includes a fourth screw hole 2326 and a first positioning protrusion 2325. The fourth screw hole 2326 and the first position protrusion 2325 are arranged in a line perpendicular to the main plate 2321.

The second fixing members 234 are also elongate. Each second fixing member 234 includes two second fixing structures and three third fixing structures. Each second fixing structure includes a fifth screw hole 2341 and a second positioning hole 2342, and is disposed at a respective end of the second fixing member 234. The fifth screw hole 2341 and the second positioning hole 2342 respectively correspond to the fourth screw hole 2326 and the first positioning protrusion 2325 of a selected one of the fixing fingers 2323 of the corresponding first fixing member 232. Each third fixing structure includes a sixth screw hole 2343 and a second positioning protrusion 2344, and corresponds to a respective first fixing structure of the second supporting portion 2365. In detail, the sixth screw hole 2343 and the second positioning protrusion 2344 thereof respectively correspond to the second screw hole 2366 and the first positioning hole 2367 of the corresponding first fixing structure of the second supporting portion 2365.

In assembly, firstly, the two first fixing members 232 are respectively engaged to the respective second side surfaces 214, so that each third screw hole 2324 of the first fixing member 232 is aligned with the corresponding first screw hole 2142 of the second side surface 214. The main plate 2321 of each first fixing member 232 is adjacent to the second side surface 214 of the display module 210, and the flange 2322 and fixing fingers 2323 are all adjacent to the rear surface 212 of the display module 210. A plurality of fasteners such as screw bolts are provided and screwed into the screw holes 2142 and 2324, so that the first fixing members 232 are fixed to the display module 210 tightly.

Secondly, the two second fixing members 234 are respectively engaged onto the rear surface 212 of the display module 210, so that the second fixing structures are adjacent to corresponding the fixing fingers 2323 of the first fixing members 232. The first positioning protrusion 2325 of the first fixing member 232 is then received in the second positioning hole 2342. A plurality of fasteners such as screw bolts are provided and screwed into the fifth screw holes 2341 and the fourth screw holes 2326, so that the second fixing members 234 are fixed to the display module 210 via the first fixing members 232. In this step, a distance between the two second fixing members 234 is controlled to be the same as a distance between the two second supporting portions 2365 in the shield cover 236.

Thirdly, the PCB 220 is inserted into the shield cover 236. The combined shield cover 236 with the PCB 220 inside is then engaged onto the rear surface 212 of the display module 210, so that the first supporting portions 2634 are adjacent to the rear surface 212, and each second supporting portion 2365 is adjacent to a respective second fixing member 234. The second screw holes 2366 of the second supporting portions 2365 are aligned with the corresponding sixth screw holes 2343 of the second fixing members 243, and the second positioning protrusions 2365 are received in the corresponding first positioning holes 2367. Thereafter, a plurality of fasteners such as screw bolts are provided and respectively screwed into the second screw holes 2366 and the corresponding sixth screw holes 2343, so that the shield cover 236 is fixed to the display module 210 via the first and second fixing members 232 and 234, with the PCB 220 received inside.

Finally, the assembled display module 210, PCB 220, and shield member 230 is engaged to the back shell 240, with the shield cover 236 contained in the extending portion 246 of the back shell 240. Moreover, a front frame (not shown) is provided and fixed to the back shell 240, so as to contain the assembled display module 210, PCB 220, and shield member 230 tightly.

With this configuration, when the flat panel display 200 is in operation, the shield cover 236 prevents the ambient electromagnetic waves from interfering with the control circuits on the PCB 220, so as to avoid the control circuits outputting erroneous signals to the display module 110. In the flat panel display 200, as described above, the size of the shield cover 236 is determined according to the size of the PCB 220. Because the size of the PCB 220 is usually much smaller than that of the display module 210, and the fixing members 232 and 234 are all thin, elongate structures needing only a little material, the material used in manufacturing the shield member 230 is minimal. That is, material is saved in manufacturing the flat panel display 200, which enables the flat panel display 200 to have a low cost.

Furthermore, because less material is used in making the shield member 230, the weight of the flat panel display 200 is reduced. Therefore, the flat panel display 200 is more convenient for the user.

Moreover, because a plurality of fixing fingers 2323 are disposed in each first fixing member 232, the second fixing member 234 can be fixed to a selected, suitable fixing finger 2323. That is, the shield cover 236 can be fixed to other positions, and the assembly of the shield member 230 is very flexible. Thus, a different back shell 240 having a different structure can still be employed in the flat panel display 200.

Figure 3:
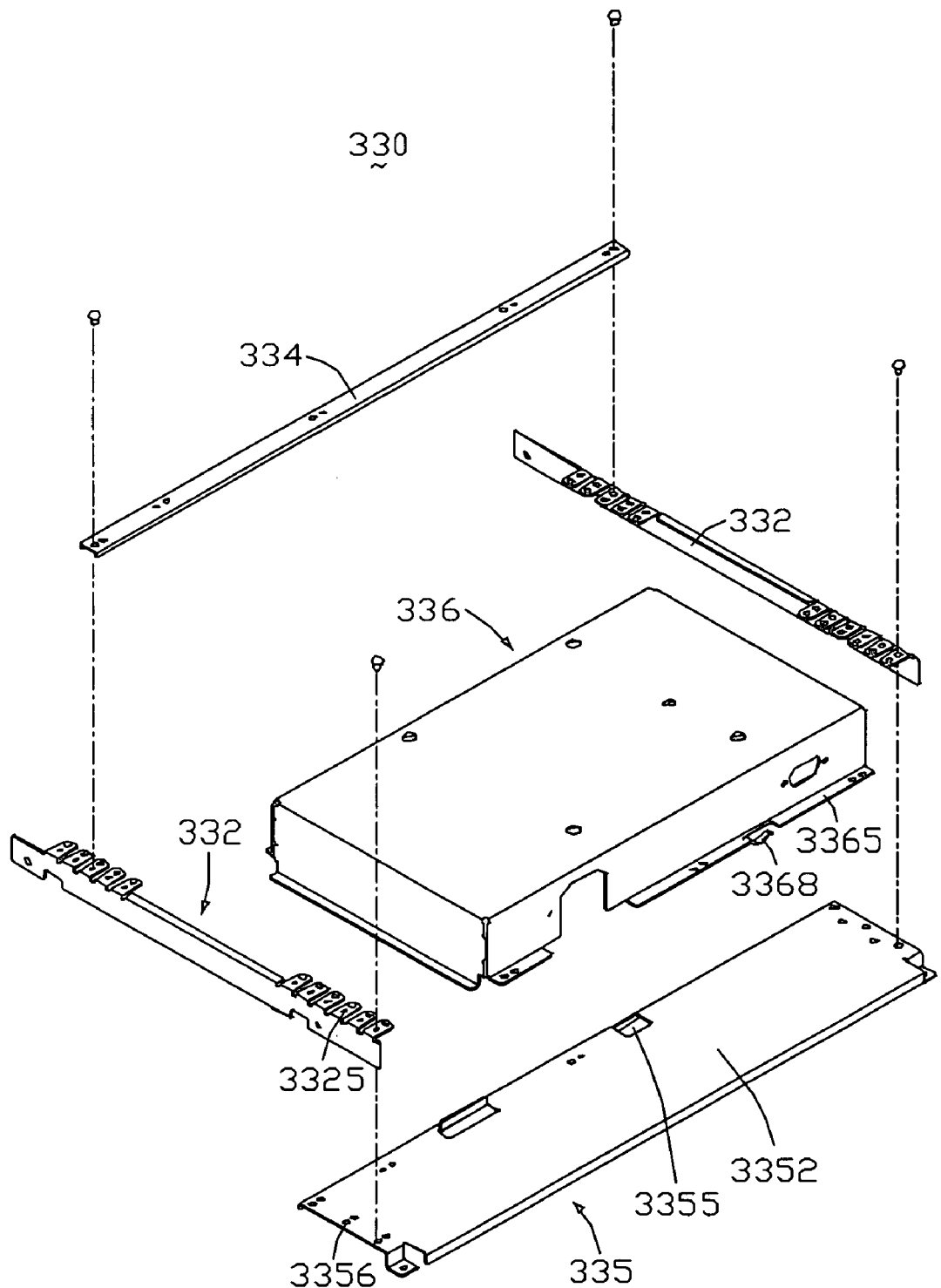
FIG. 3 is a rear, exploded, isometric view of a shield member of a flat panel display according to a second exemplary embodiment of the present invention.

FIG. 3 is a rear, exploded, isometric view of a shield member of a flat panel display according to a second exemplary embodiment of the present invention. The shield member 330 is similar to the above-described shield member 230. However, the shield member 330 includes two first fixing members 332, a second fixing member 334, a third fixing member 335, and a shield cover 336. The first fixing members 332 have the same structure as the above-described first fixing members 232, and include a plurality of first screw holes 3325. The second fixing member 334 has the same structure as the above-described second fixing member 234.

The third fixing member 335 includes a rectangular fixing plate 3352 and a through hole 3355. The fixing plate 3352 includes two short borders and two long borders. The through hole 3355 is disposed adjacent to a long border of the fixing plate 3352. A plurality of second screw holes 3356 are disposed at the fixing plate 3352 adjacent to the short borders, and correspond to the first screw holes 3325 of the first fixing members 332. The shield cover 336 includes four supporting portions 3365. One of the supporting portions 3365 corresponds to the third fixing member 335, and includes an elastic clip 3368 configured to engaged in the through hole 3355 of the third fixing member 335.

In assembly, firstly, the third fixing member 335 is engaged and fixed to a display module (not shown), with the fixing plate 3352 adjacent to the surface of the display module. Secondly, the first fixing members 332 are fixed to the display module, with the corresponding first and second screw holes 3325 and 3356 providing fixing via screw bolts. Thirdly, the second fixing member 334 is engaged to the first fixing members 332. Fourthly, the shield cover 336 with a PCB (not shown) inside is engaged to the second and third fixing members 334 and 335, with the clip 3368 clipping to the third fixing member 335 via the through hole 3355. Therefore, the shield cover 336 is fixed to the display module tightly.

Figure 4:
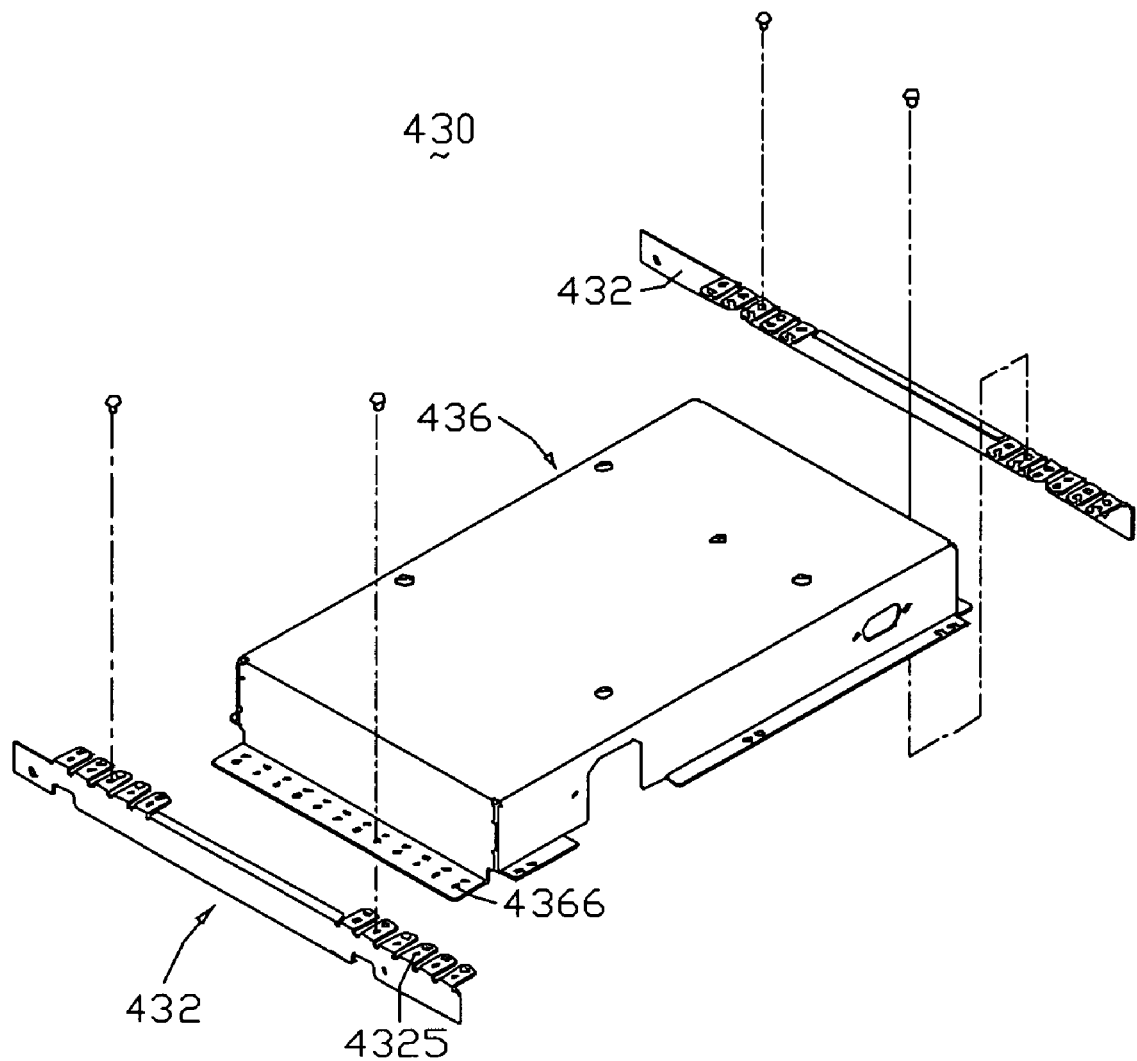
FIG. 4 is a rear, exploded, isometric view of a shield member of a flat panel display according to a third exemplary embodiment of the present invention.
Figure 5:
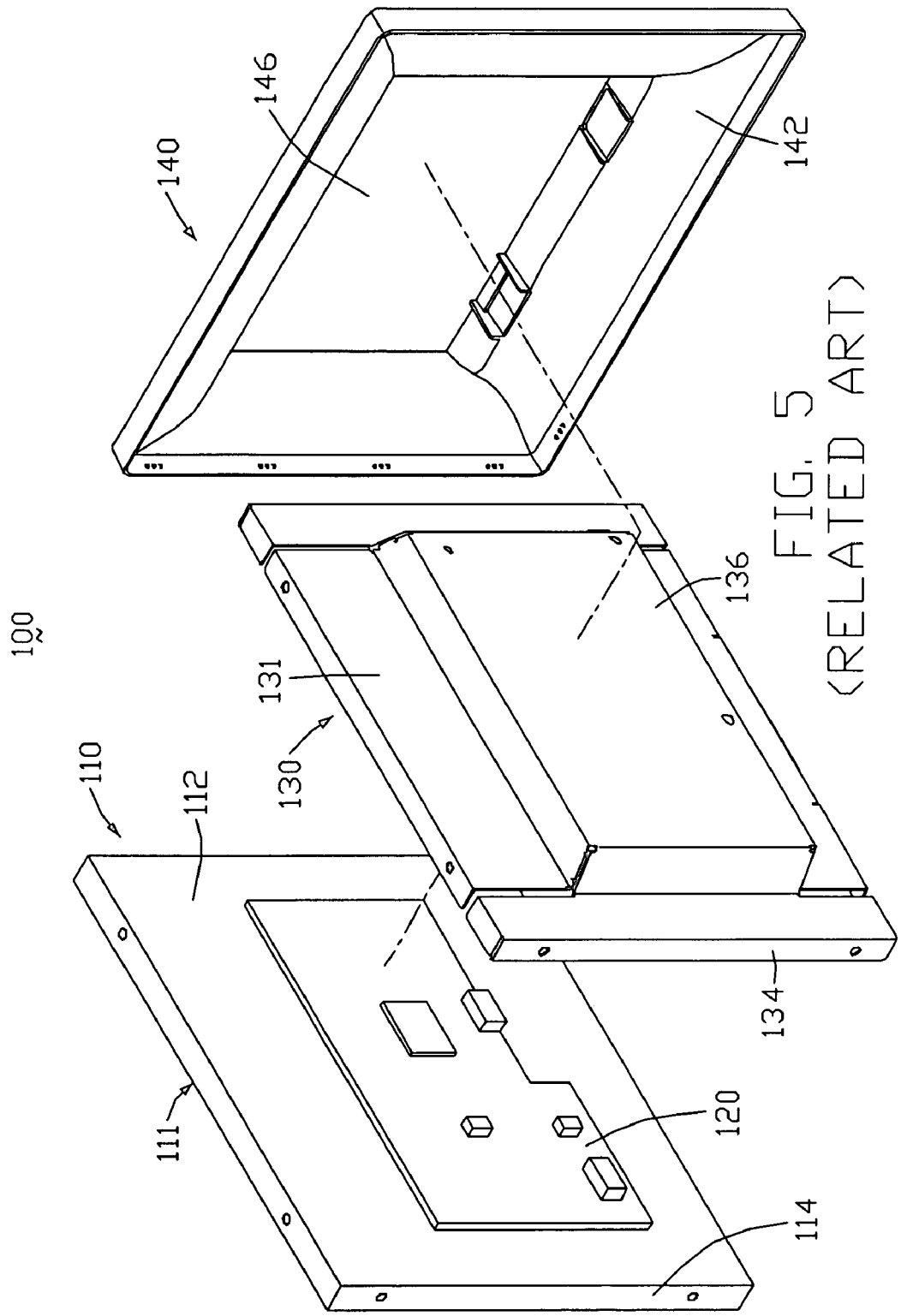
FIG. 5 is an exploded, isometric view of a conventional flat panel display.

FIG. 4 is a rear, exploded, isometric view of a shield member of a flat panel display according to a third exemplary embodiment of the present invention. The shield member 430 is similar to the above-described shield member 230. However, the shield member 430 includes a pair of fixing member 432 and a shield cover 436. Each fixing member 432 has a structure the same as the above-described first fixing member 232, and includes a plurality of first screw holes 4325. The shield cover 436 has a length the same as that of a display module (not shown) of the flat panel display, and includes two supporting portions 4364. Each of the supporting portions 4364 includes a plurality of second screw holes 4366.

In assembly, the first fixing members 432 are engaged to the display module. Then the shield cover 336 with a PCB (not shown) inside is engaged to the first fixing member 432 via screw bolts screwing into both of the screw holes 4325 and 4366.

It is to be further understood that even though numerous characteristics and advantages of preferred and exemplary embodiments have been set out in the foregoing description, together with details of the structures and functions of the embodiments, the disclosure is illustrative only; and that changes may be made in detail within the principles of present invention to the full extent indicated by the broad general meaning of the terms in which the appended claims are expressed.

What is claimed is:

1. A flat panel display, comprising:
    a display module comprising a rear surface and a side surface adjacent to the rear surface;
    a printed circuit board electrically coupled to the display module; and
    a shield member configured to protect the printed circuit board from electromagnetic interference, the shield member comprising a shield cover and a first fixing member, the first fixing member comprising a plurality of fixing fingers that are adjacent to the rear surface of the display module;
    wherein the shield cover and the first fixing member are separate parts, the printed circuit board is received in the shield cover, the first fixing member is fixed onto the side surface of the display module, and the shield cover is fixed onto the rear surface of the display module via the fixing fingers.

2. The flat panel display as claimed in claim 1, wherein the first fixing member further comprises a main plate, the plurality of fixing fingers extend perpendicularly from the main plate, and the main plate is fixed onto the side surface of the display module.

3. The flat panel display as claimed in claim 2, wherein each fixing finger comprises a first positioning protrusion arranged thereon, and the first positioning protrusion is configured to fix the shield cover in position.

4. The flat panel display as claimed in claim 2, wherein the first fixing member further comprises a flange extending perpendicularly from the middle of the main plate, and the flange is adjacent to the rear surface of the display module and between two of the fixing fingers.

5. The flat panel display as claimed in claim 3, wherein the shield member further comprises a second fixing member, and the second fixing member is fixed to a selected one of the fixing fingers of the first fixing member.

6. The flat panel display as claimed in claim 5, wherein the second fixing member is elongate.

7. The flat panel display as claimed in claim 5, wherein the second fixing member comprises a first positioning hole, and the first positioning hole receives the first positioning protrusion of the selected one of the fixing fingers.

8. The flat panel display as claimed in claim 7, wherein each fixing finger further comprises a first screw hole adjacent to the first positioning protrusion, the second fixing member further comprises a second screw hole corresponding to the first screw hole in each fixing finger, and a fastener is screwed into the first and second screw holes.

9. The flat panel display as claimed in claim 8, wherein the second fixing member further comprises a second positioning protrusion, and the second positioning protrusion is disposed in the middle of the second fixing member.

10. The flat panel display as claimed in claim 9, wherein the shield cover comprises a first supporting portion, the first supporting portion comprises a second positioning hole corresponding to the second positioning protrusion, and the second positioning hole receives the second positioning protrusion.

11. The flat panel display as claimed in claim 10, wherein the second fixing member further comprises a third screw hole disposed adjacent to the second positioning protrusion, the supporting portion further comprises a fourth screw hole corresponding to the third screw hole in the second fixing member, and a fastener is screwed into the third and fourth screw holes.

12. The flat panel display as claimed in claim 5, wherein the shield member further comprises a third fixing member comprising a fixing plate, and the fixing plate is adjacent to the rear surface of the display module and fixed to a selected one of the fixing fingers of the first fixing member.

13. The flat panel display as claimed in claim 12, wherein the fixing plate comprises a through hole, the shield cover comprises a supporting portion having a clip, and the third fixing member is fixed to the shield cover via the clip cooperating with the through hole.

14. The flat panel display as claimed in claim 3, wherein each fixing finger further comprises a first screw hole adjacent to the first positioning protrusion, the shield cover comprises a supporting portion parallel and adjacent to the rear surface of the display module, the supporting portion comprises a plurality of second screw holes corresponding to the first screw holes, and a plurality of fasteners are screwed into the first and second screw holes.

15. The flat panel display as claimed in claim 1, wherein a size of the shield cover is smaller than that of the display module.

16. The flat panel display as claimed in claim 15, wherein the size of the shield cover is determined based on the size of the printed circuit board.

17. A flat panel display, comprising:
- a display module comprising a rear surface and a side surface adjacent to the rear surface;
- a printed circuit board electrically coupled to the display module; and
- a shield member configured to protect the printed circuit board from electromagnetic interference, the shield member comprising a shield cover and a fixing member, the fixing member comprising a plurality of fixing fingers;
- wherein the printed circuit board is received in the shield cover, the fixing member is fixed to the side surface of the display module, and the shield cover is fixed onto a desired position of the rear surface via a selected one of the fixing fingers of the fixing member.

18. The flat panel display as claimed in claim 17, wherein the shield member further comprises another fixing member that comprises a fixing plate adjacent to the rear surface of the display module and fixed to the selected fixing finger of the fixing member, and the fixing plate comprises a through hole, the shield cover comprises a supporting portion having a clip, and the another fixing member is fixed to the shield cover via the clip cooperating with the through hole.

\* \* \* \* \*